(12) United States Patent
Kim (10) Patent No.: US 7,847,367 B2
(45) Date of Patent: Dec. 7, 2010

(54) SEMICONDUCTOR DEVICES HAVING A GATE ELECTRODE AND METHODS OF FABRICATING THE SAME

(75) Inventor: Dae-Ik Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 295 days.

(21) Appl. No.: 11/985,511

(22) Filed: Nov. 15, 2007

(65) Prior Publication Data

US 2008/0111208 A1 May 15, 2008

(30) Foreign Application Priority Data

Nov. 15, 2006 (KR) .................... 10-2006-0112966

(51) Int. Cl.
*H01L 29/43* (2006.01)
*H01L 21/283* (2006.01)

(52) U.S. Cl. ............... 257/508; 257/E29.111; 257/288; 257/330; 257/E29.126; 257/E29.128; 257/E29.132; 257/E29.133; 257/E29.134; 257/E29.137; 257/E29.15; 438/589

(58) Field of Classification Search ......... 257/508, 257/E21.159, E21.621, E29.111, E29.126, 257/E29.128, E29.132, E29.133, E29.134, 257/E29.137, E29.15, E29.157, 288, 330; 438/589

See application file for complete search history.

(56) References Cited

U.S. PATENT DOCUMENTS

| 6,930,363 | B2 | 8/2005 | Jeng et al. ............. 257/413 |
| 7,195,966 | B2 * | 3/2007 | Park et al. ............. 438/210 |
| 2007/0063257 | A1 * | 3/2007 | Hur et al. ............. 257/315 |

FOREIGN PATENT DOCUMENTS

| KR | 1020000061287 | 10/2000 |
| KR | 1020040001868 | 1/2004 |
| KR | 1020050052027 | 6/2005 |

* cited by examiner

*Primary Examiner*—Matthew E Warren
*Assistant Examiner*—David Spalla
(74) *Attorney, Agent, or Firm*—Myers Bigel Sibley & Sajovec (57) ABSTRACT

An integrated circuit device includes an integrated circuit substrate and a first gate pattern on the substrate. A non-conductive barrier layer pattern is on the first gate pattern. The barrier layer pattern has openings at selected locations therein extending to the first gate pattern. A second gate pattern is on the barrier layer pattern and extends into the opening in the barrier layer pattern to electrically connect the second gate pattern to the first gate pattern.

15 Claims, 13 Drawing Sheets

SEMICONDUCTOR DEVICES HAVING A GATE ELECTRODE AND METHODS OF FABRICATING THE SAME

CROSS-REFERENCE TO RELATED APPLICATION

This application is related to and claims priority under 35 U.S.C. §119 from Korean Patent Application No. 10-2006-112966, filed Nov. 15, 2006, the disclosure of which is hereby incorporated herein by reference in its entirety.

BACKGROUND OF THE INVENTION

The present invention relates to semiconductor devices and methods of fabricating the same and, more particularly, to semiconductor devices having a gate electrode and methods of fabricating the same.

As semiconductor devices become more highly integrated, a channel length (e.g., a width of a gate electrode) of a metal-oxide-semiconductor (MOS) transistor therein has generally been reduced. The reduction of the channel length may lead to an increase of electrical resistance of the gate electrode. A multi-layered conductive film has been widely used as the material of the gate electrode to reduce the electrical resistance thereof. For example, the gate electrode may be formed of a combination layer, such as a polycide layer that includes a polysilicon layer and a metal silicide layer having a low resistivity. However, when the gate electrode is formed as a polycide layer, the polycide layer may exhibit a non uniform interface profile between the polysilicon layer and the metal silicide layer in a subsequent annealing process.

In general, the gate electrode is formed by patterning the polycide layer using a photolithography process and an etch process, and a re-oxidation annealing process is performed to cure etch damage caused to a gate insulating layer under the gate electrode during the etch process for forming the gate electrode. However, the gate electrode may lean during the re-oxidation annealing process. The gate leaning phenomenon may be illustrated using an oxidation enhanced silicon consumption model. The oxidation enhanced silicon consumption model may include two components, e.g., a silicon consumption component and a silicon pumping component.

The silicon consumption component relates to a phenomenon that silicon atoms in the polysilicon layer are consumed at an interface between the polysilicon layer and the metal silicide layer during the re-oxidation annealing process. The silicon consumption may occur when the metal silicide layer is a metal rich silicide layer. The silicon pumping component relates to a phenomenon that silicon atoms in the polysilicon layer are moved to form an oxide layer of the metal silicide layer during the re-oxidation process. In other words, when the metal silicide layer is oxidized, metal atoms and silicon atoms in the metal silicide layer are not consumed. Also, the silicon atoms in the polysilicon layer are generally moved by grain boundary diffusion during the re-oxidation process.

When the gate leaning phenomenon occurs, two adjacent gate electrodes may be electrically connected and voids may be generated in an interlayer insulating layer that is formed on the gate electrodes. This gate leaning phenomenon may be more severe when fabricating a MOS transistor having a recessed channel (e.g., a recessed gate). The MOS transistor having a recessed channel has been proposed to suppress a short channel effect of the MOS transistor without any area penalty. The recessed channel may be formed by etching a portion of an active region, and a gate electrode may be formed by stacking a polysilicon layer filling the recessed channel and a metal silicide layer on the polysilicon layer. In this case, a profile of the recessed channel may be transferred to an interface between the polysilicon layer and the metal silicide layer. Thus, the gate leaning phenomenon may more readily occur during fabrication of the MOS transistor having the recessed channel.

SUMMARY OF THE INVENTION

In some embodiments, an integrated circuit device includes an integrated circuit substrate and a first gate pattern on the substrate. A non-conductive silicon atom transfer barrier layer pattern is on the first gate pattern. The barrier layer pattern has openings at selected locations therein extending to the first gate pattern. A second gate pattern is on the barrier layer pattern and extends into the opening in the barrier layer pattern to electrically connect the second gate pattern to the first gate pattern.

In other embodiments, the first gate pattern is a polysilicon layer and the second gate pattern is a metal silicide layer. The barrier layer pattern may be a material layer that limits movement of silicon atoms from the first gate pattern into the second gate pattern. The barrier layer pattern may be a silicon nitride layer, a silicon oxynitride layer and/or a silicon oxide layer.

In further embodiments, the second gate pattern is a tungsten silicide layer, a combination of tungsten silicide and tungsten nitride, or a combination of tungsten, tungsten nitride and tungsten silicide. The barrier layer pattern may be a plurality of sub-barrier layer patterns that are separated from one another to define the openings in the barrier layer pattern and a portion of the first gate pattern is exposed by at least one of spaces between the sub-barrier layer patterns.

In other embodiments an integrated circuit device includes an integrated circuit substrate and an isolation layer in the substrate that defines a plurality of active regions. A first gate pattern is disposed on the active regions and the isolation layer that extends along a gate pattern direction. A second gate pattern is on the first gate pattern and a barrier layer pattern is between the first and second gate patterns. The barrier layer pattern is configured to electrically connect the first gate pattern to the second gate pattern.

In further embodiments, the device further includes at least one recessed region in each of the active regions and the first gate pattern fills the recessed region in each of the active regions. The first gate pattern may be a polysilicon layer and the second gate pattern may be a metal silicide layer. The barrier layer pattern may be a silicon nitride layer, a silicon oxynitride layer and/or a silicon oxide layer. The second gate pattern may be a tungsten silicide layer, a combination of tungsten silicide and tungsten nitride, or a combination of tungsten, tungsten nitride and tungsten silicide.

In further embodiments the barrier layer pattern is a plurality of sub-barrier layer patterns that are separated from one another and a portion of the first gate pattern is exposed by at least one of spaces between the sub-barrier layer patterns. The barrier layer pattern may have an opening that exposes a portion of the first gate pattern.

In yet further embodiments, a method of fabricating an integrated circuit device includes forming a first gate conductive layer on an integrated circuit substrate. A non-conductive silicon atom transfer barrier layer is formed on the first gate conductive layer, the barrier layer having an opening that exposes a portion of the first gate conductive layer. A second gate conductive layer is formed on the barrier layer and extending into the opening to electrically connect the second gate conductive layer to the first gate conductive layer. The second gate conductive layer, the barrier layer and the first gate conductive layer are patterned to form a first gate pattern, a barrier layer pattern disposed on the first gate pattern, and a second gate pattern disposed on the barrier layer pattern and extending into the opening to contact the first gate pattern.

In other embodiments, forming the first gate conductive layer is preceded by forming an isolation layer in the integrated circuit to define an active region and etching a portion of the active region to form at least one recess region in the active region. Forming the first gate conductive layer includes forming the first gate conductive layer to fill the recessed region and to cover the active region and the isolation layer. Forming the barrier layer may include forming the opening over the active region and/or the isolation layer.

In further embodiments, the first gate conductive layer is a polysilicon layer and the second gate conductive layer is a metal silicide layer. The barrier layer may be a silicon nitride layer, a silicon oxynitride layer and/or a silicon oxide layer. Forming the barrier layer may include forming a plurality of sub-barrier layer patterns that are separated from one another to define the opening in the barrier layer pattern and a portion of the first gate pattern is exposed by at least one of spaces between the sub-barrier layer patterns.

BRIEF DESCRIPTION OF THE DRAWINGS

Embodiments of the invention can be understood in more detail from the following descriptions taken in conjunction with the accompanying drawings in which.

DETAILED DESCRIPTION OF THE EMBODIMENTS

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments will now be described that are directed to a semiconductor device including a recessed gate that has a bottom surface lower than a top surface of a semiconductor substrate and a method of fabricating the same. However, the present invention is not limited to such semiconductor devices having a recessed gate. For example, some embodiments of the present invention may be applied to a conductive pattern on a flat surface without any recessed profile and/or a gate electrode of a planar MOS transistor without any recessed channel. Further, even though some embodiments of the present invention are described in conjunction with the gate electrode including a polysilicon layer and a metal silicide layer, embodiments of the present invention may be applied to other conductive patterns, for example, those including three or more layers of stacked structure.

Figure 1:
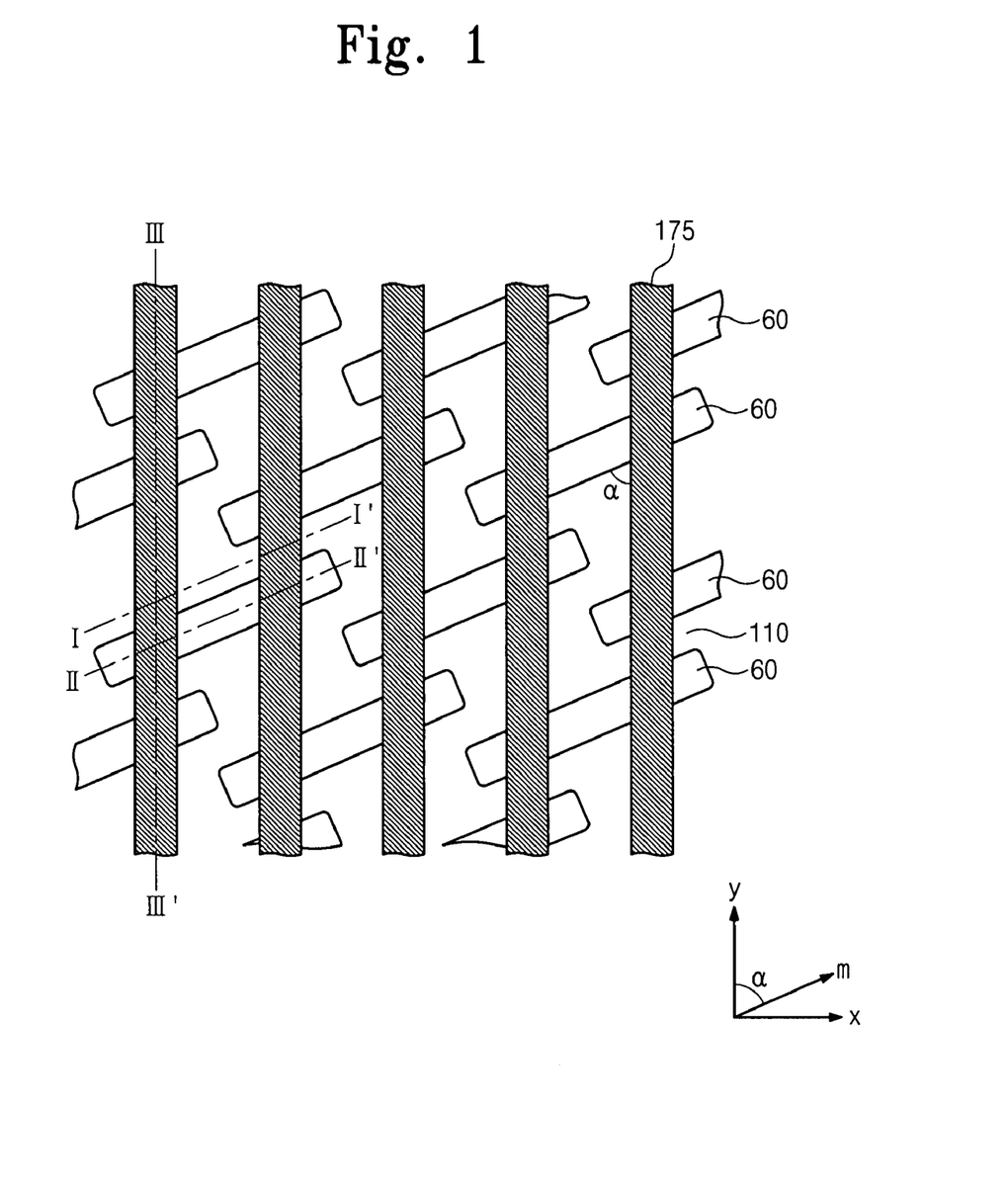
FIG. 1 is a plan view illustrating a semiconductor device having recessed gate electrodes according to some embodiments of the present invention.

FIG. 1 is a plan view illustrating an integrated circuit device, in particular a semiconductor device having a recessed gate, according to some embodiments of the present invention. Referring to FIG. 1, active regions 60 are provided in an integrated circuit substrate such as a semiconductor substrate. The active regions 60 may have a specific configuration, as shown in FIG. 1. However, the active regions 60 may have a different configuration from that shown in FIG. 1. The active regions 60 may be separated from one another by an isolation layer 110. A plurality of gates 175 extend across and over the active regions 60. For example, two of the plurality of gates 175 may be disposed to intersect one of the active regions 60 as shown in FIG. 1. This arrangement of the gates 175 is shown for exemplary purposes and the present invention is not limited to such an arrangement.

The gates 175 may be parallel to a y-axis (column) and the active regions 60 may be parallel to an "m" direction. The active regions 60 may be disposed to intersect an x-axis (row). In other embodiments, however, the active regions 60 may be disposed, for example, to be parallel to the x-axis. The x-axis and the y-axis are axes of coordinates that cross at a right angle. For the purpose of convenience in explanation, a line which is parallel to the "m" direction is referred to as an inclined row hereinafter. Both edges of the active regions 60 in a specific inclined row may overlap with both edges of the active regions 60 in another inclined row that is adjacent to the specific inclined row.

The gates 175 may intersect the active regions 60 at a predetermined angle α. In some embodiments, the angle α may be a right angle, an acute angle or an obtuse angle.

Each of the gates 175 may comprise a first gate pattern and a second gate pattern, which are sequentially stacked. Each gate 175 may further comprise a barrier layer pattern disposed between the first and second gate patterns. The barrier layer pattern may expose a portion of the first gate pattern. Accordingly, the second gate pattern may be electrically connected to the first gate pattern.

The barrier layer pattern, according to some embodiments, will be described in more detail with reference to FIGS. 2A to 2C. To simplify the drawings, the second gate patterns on the barrier layer patterns are not shown in FIGS. 2A to 2C.

Figure 2A:
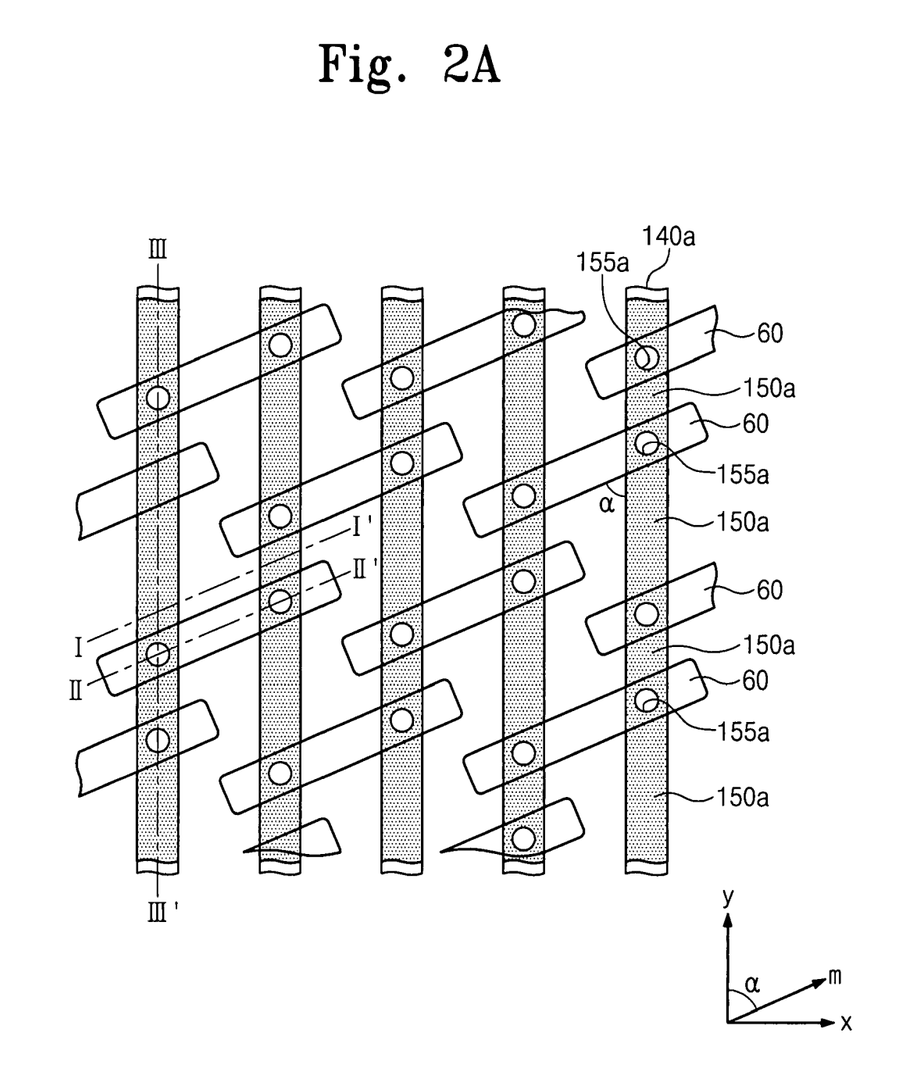
FIGS. 2A to 2C are plan views illustrating barrier layer patterns employed in semiconductor devices according to some embodiments of the present invention.

FIG. 2A is a plan view illustrating barrier layer patterns 150a according to some embodiment of the present invention. Referring to FIG. 2A, the first gate patterns 140a are disposed to be parallel to the columns. The barrier layer patterns 150a are disposed on the first gate patterns 140a, respectively. Each of the barrier layer patterns 150a includes openings 155a that expose some portions of the first gate pattern 140a. In the illustrated embodiments of FIG. 2A, the openings 155a may be located over the active regions 60. Accordingly, the first gate pattern 140a (e.g., polysilicon pattern) may be in contact with the second gate pattern (e.g., metal silicide pattern) through the openings 155a. The position and the number of the openings 155a may be varied by those skilled in the art without departing from the spirit and scope of the present invention. For example, the openings 155a may be located over the isolation layer or both the active region and the isolation layer.

Figure 2B:
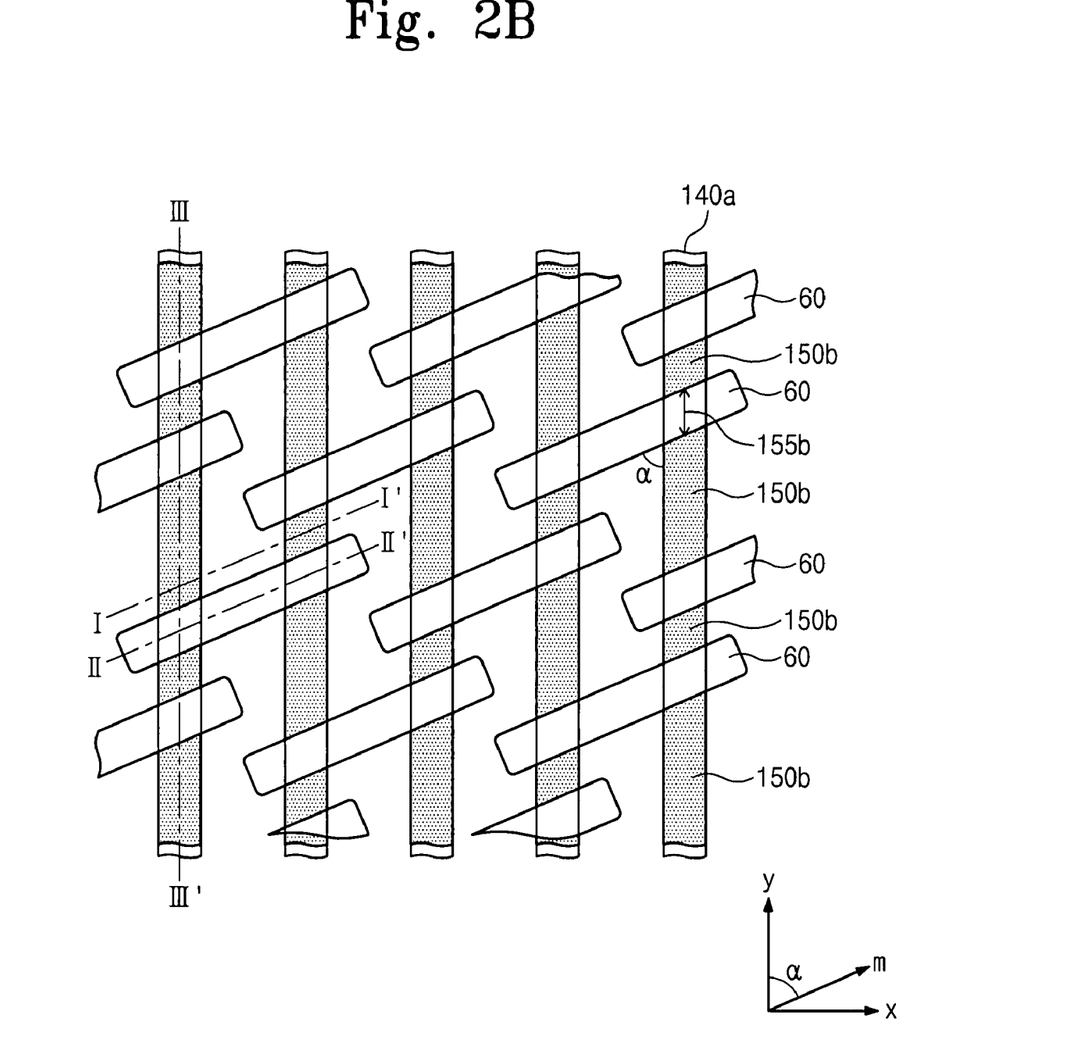

FIG. 2B is a plan view illustrating a barrier layer pattern 150b according to further embodiments of the present invention. Referring to FIG. 2B, the barrier layer patterns 150b is disposed on each of the first gate patterns 140a. The barrier layer pattern 150b may comprise a plurality of sub-barrier layer patterns that are separated from one another to provide spaces 155b therebetween. Thus, some portions of the first gate pattern 140a may be exposed by the spaces 155b, and the spaces 155b may overlap with the active regions 60. Accordingly, the first gate pattern 140a (e.g., polysilicon pattern) may be in contact with the second gate pattern (e.g., metal silicide pattern) through the spaces 155b.

Figure 2C:
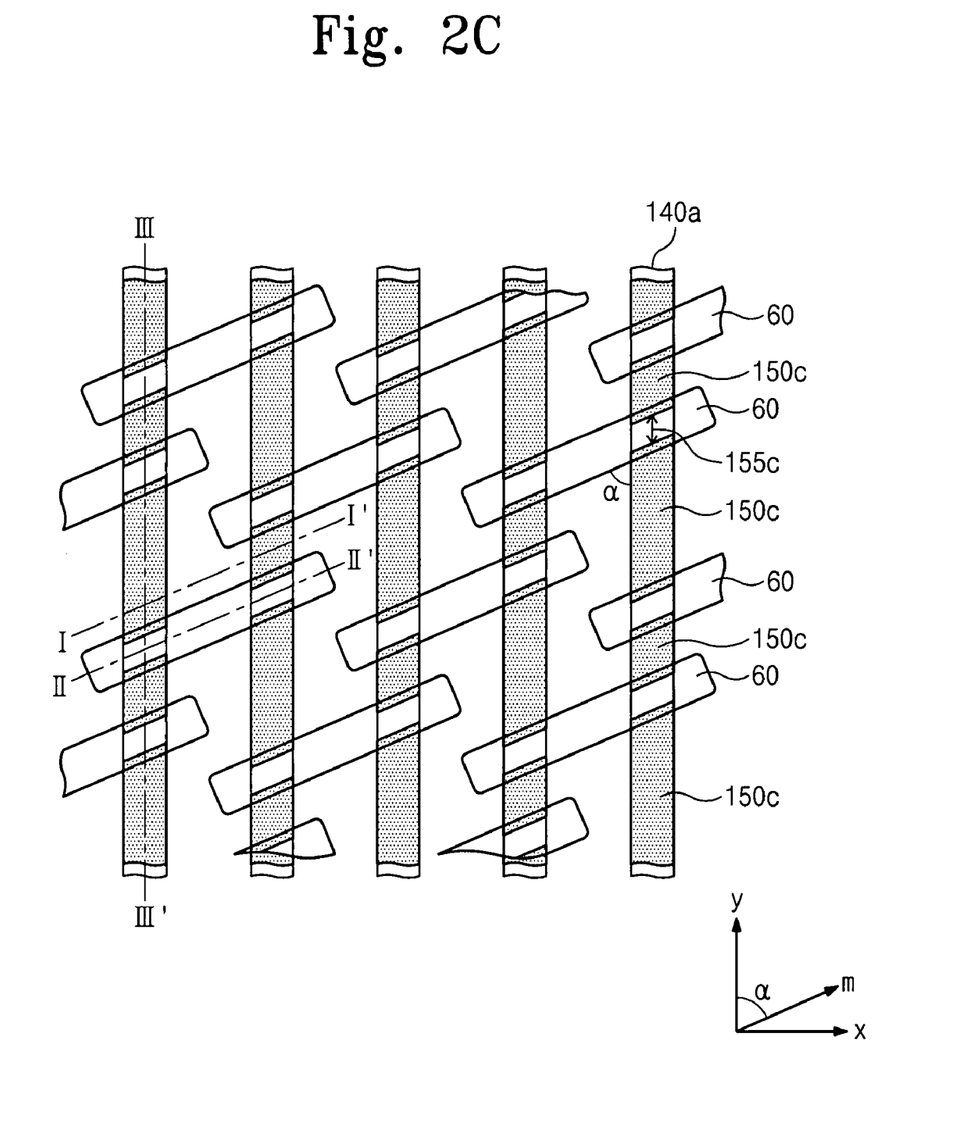

The sub-barrier layer patterns shown in FIG. 2B may extend onto the active regions 60 as illustrated in FIG. 2C. In this case, the contact area between the first and second gate patterns may be reduced as compared to the embodiments shown in FIG. 2B. Referring to FIG. 2C, the barrier layer pattern 150c may also comprise a plurality of sub-barrier layer patterns that are separated from one another and the sub-barrier layer patterns may be located over the isolation layer. Spaces 155c between the sub-barrier layer patterns may be located over the active regions 60. However, the spaces 155c may be narrower (relative to the first gate pattern 140a) than the spaces 155b of the embodiments shown in FIG. 2B. The first gate pattern 140a (e.g., polysilicon pattern) may be in contact with the second gate pattern (e.g., metal silicide pattern) through the spaces 155c.

According to some embodiments as described above, the barrier layer patterns 150a, 150b or 150c are disposed between the first and second gate patterns, and the first and second gate patterns may contact each other through the openings 155a or the spaces 155b or 155c that are defined by the barrier layer patterns 150a, 150b or 150c. Thus, the reaction between the first and second gate patterns may be significantly suppressed due to the presence of the barrier layer patterns 150a, 150b or 150c therebetween. In other words, the barrier layer patterns 150a, 150b or 150c can suppress a silicon migration phenomenon where silicon atoms in the first gate patterns move into the second gate patterns. This may be the case as the barrier layer patterns 150a, 150b and/or 150c reduce the contact area between the first and second gate patterns.

Figure 3:
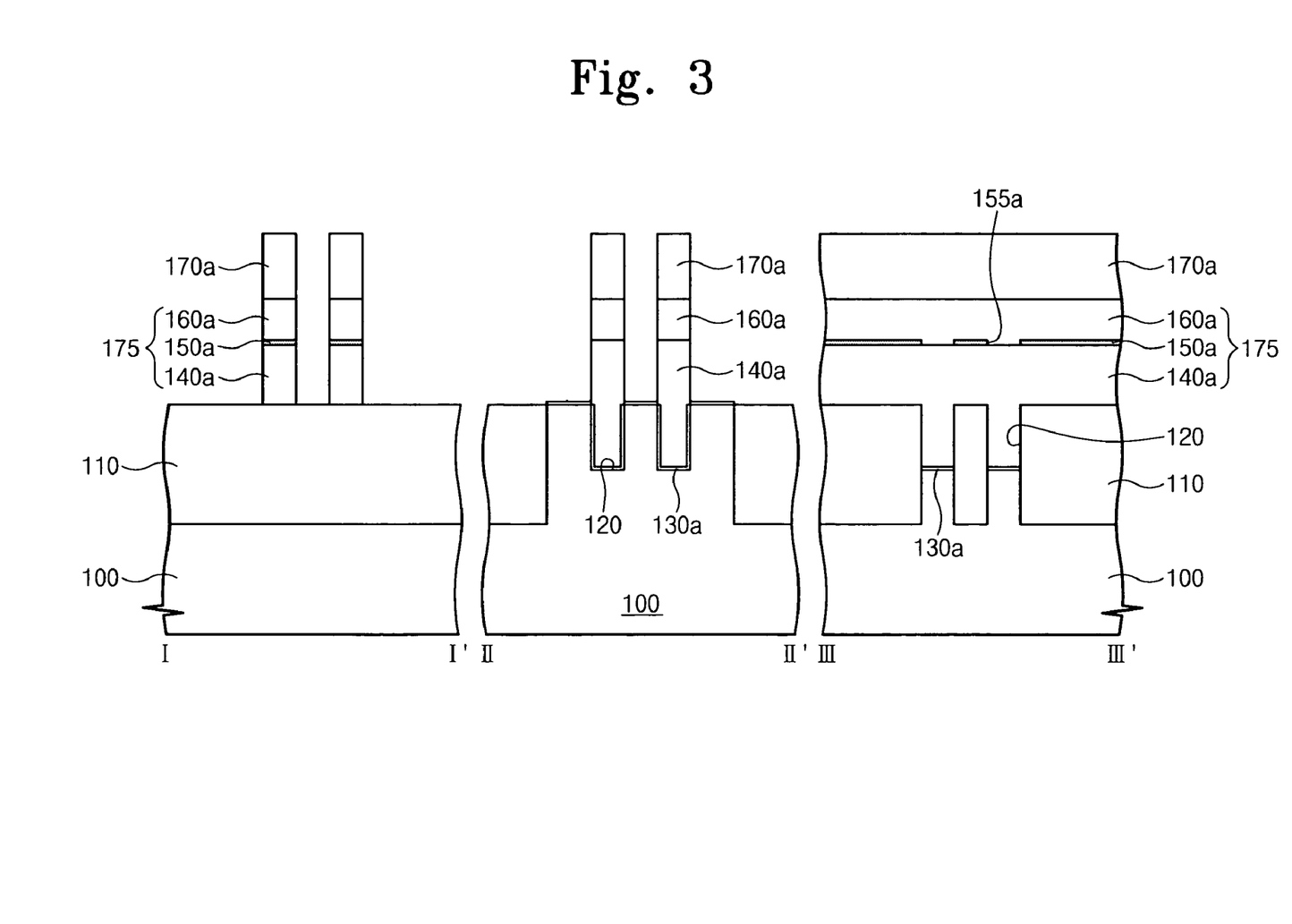
FIG. 3 is a cross sectional view taken along the lines I-I', II-II' and III-III' of FIG. 1.

FIG. 3 is a cross sectional view taken along the lines I-I', II-II' and III-III' of FIG. 1, to further illustrate gate structures according to some embodiments of the present invention. Referring to FIG. 3, a pair of recessed regions 120 are provided in an active region 60. A gate insulating layer pattern 130a is disposed on a sidewall and a bottom surface of each recessed region 120. Two recessed gates 175 are disposed to cross over the active region 60. Each of the recessed gates 175 includes a first gate pattern 140a, a second gate pattern 160a and a barrier layer pattern 150a therebetween. The first gate pattern 140a may comprise a polysilicon layer and fill the recessed region 120. The second gate pattern 160a may comprise a metal silicide layer and contact the first gate pattern 140a through openings 155a that penetrate the barrier layer pattern 150a. The barrier layer pattern 150a may comprise a material layer that limits or even prevents silicon atoms in the first gate pattern 140a from being diffused into the second gate pattern 160a. For example, the barrier layer pattern 150a may comprise a silicon nitride layer, a silicon oxynitride layer, a silicon oxide layer and/or a combination layer thereof. The silicon atoms in the first gate pattern 140a may be diffused into the second gate pattern 160a substantially only through the openings 155a in the barrier layer pattern 150a during a subsequent annealing process.

The second gate pattern 160a may comprise a single layer, for example, of tungsten silicide, a combination layer of tungsten silicide and tungsten nitride, and/or a combination layer of tungsten, tungsten nitride and tungsten silicide.

A hard mask pattern 170a is disposed on the recessed gate 175, e.g., the second gate pattern 160a. The hard mask pattern 170a may comprise, for example, a silicon nitride layer, a silicon oxide layer, a silicon oxynitride layer and/or a combination layer thereof.

The openings 155a may be located over the active regions 60, e.g, the recessed regions 120. However, the position and the number of the openings 155a may be varied without departing from the spirit and scope of the present invention. For example, the openings 155a may be located over the isolation layer or both the active region and the isolation layer.

In other embodiments, the barrier layer pattern 150a may be replaced with the barrier layer pattern 150b having the spaces 155b described with reference to FIG. 2B and/or the barrier layer pattern 150c having the spaces 155c described with reference to FIG. 2C.

FIGS. 4A to 4E are cross sectional views illustrating a method of fabricating the semiconductor device shown in FIG. 1 according to some embodiments of the present invention. FIGS. 4A to 4E are cross sectional views taken along the lines I-I', II-II' and III-III' of FIG. 1.

Figure 4A:
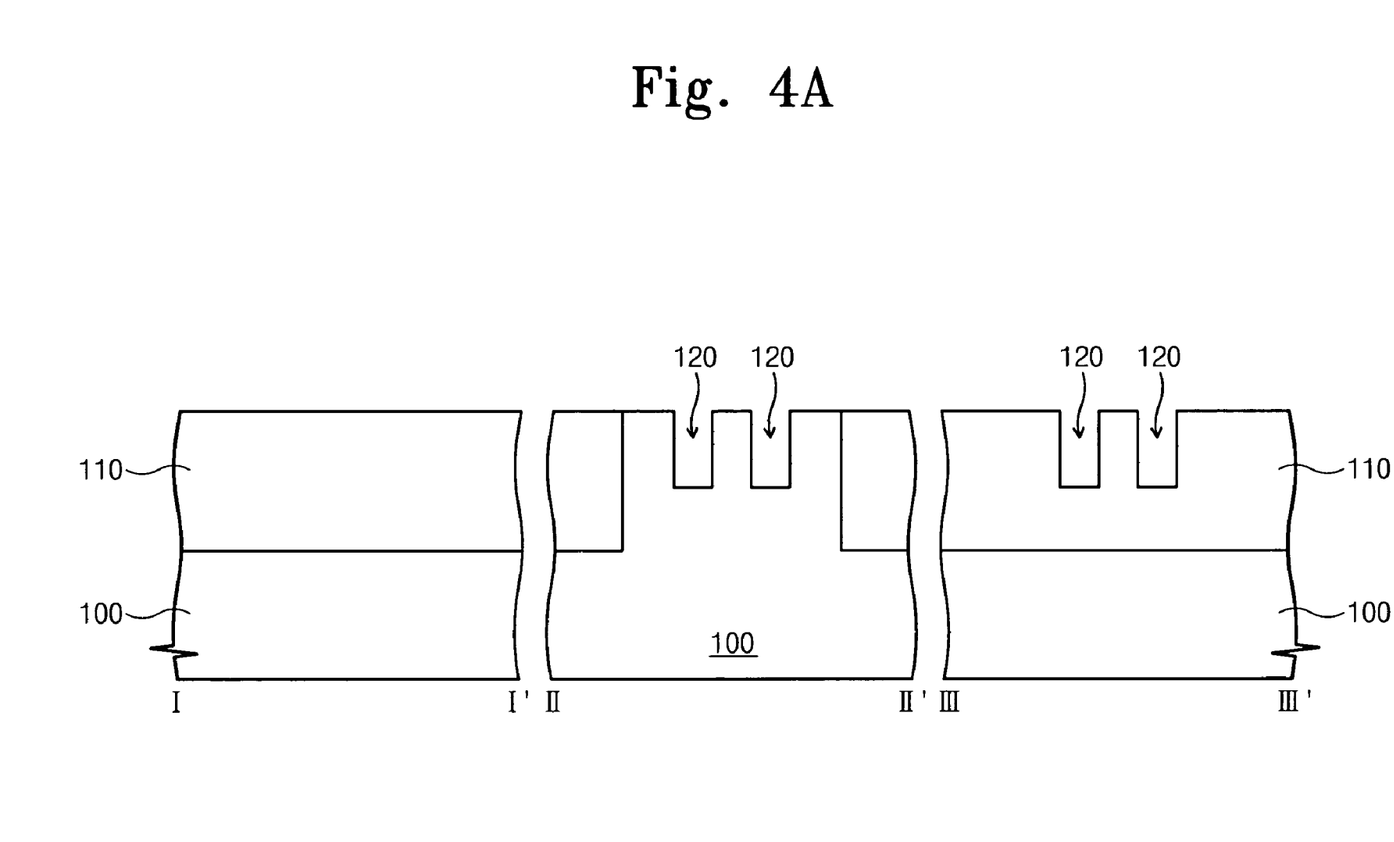
FIGS. 4A to 4E are cross sectional views illustrating a method of fabricating the semiconductor device shown in FIG. 3 according to some embodiments of the present invention.

Referring to FIG. 4A, an isolation layer 110 is formed in a semiconductor substrate 100 to define active regions 110. The isolation layer 110 may be formed, for example, using a shallow trench isolation (STI) technique. The active regions 110 may be etched to form recessed regions 120 in the active regions 110. Lower corners of the recessed regions 120 may be rounded using, for example, a wet cleaning process and/or a dry cleaning process. The wet cleaning process may be performed using a mixture of ammonium hydroxide ($NH_4OH$), hydrogen peroxide ($H_2O_2$) and de-ionized water ($H_2O$).

Figure 4B:
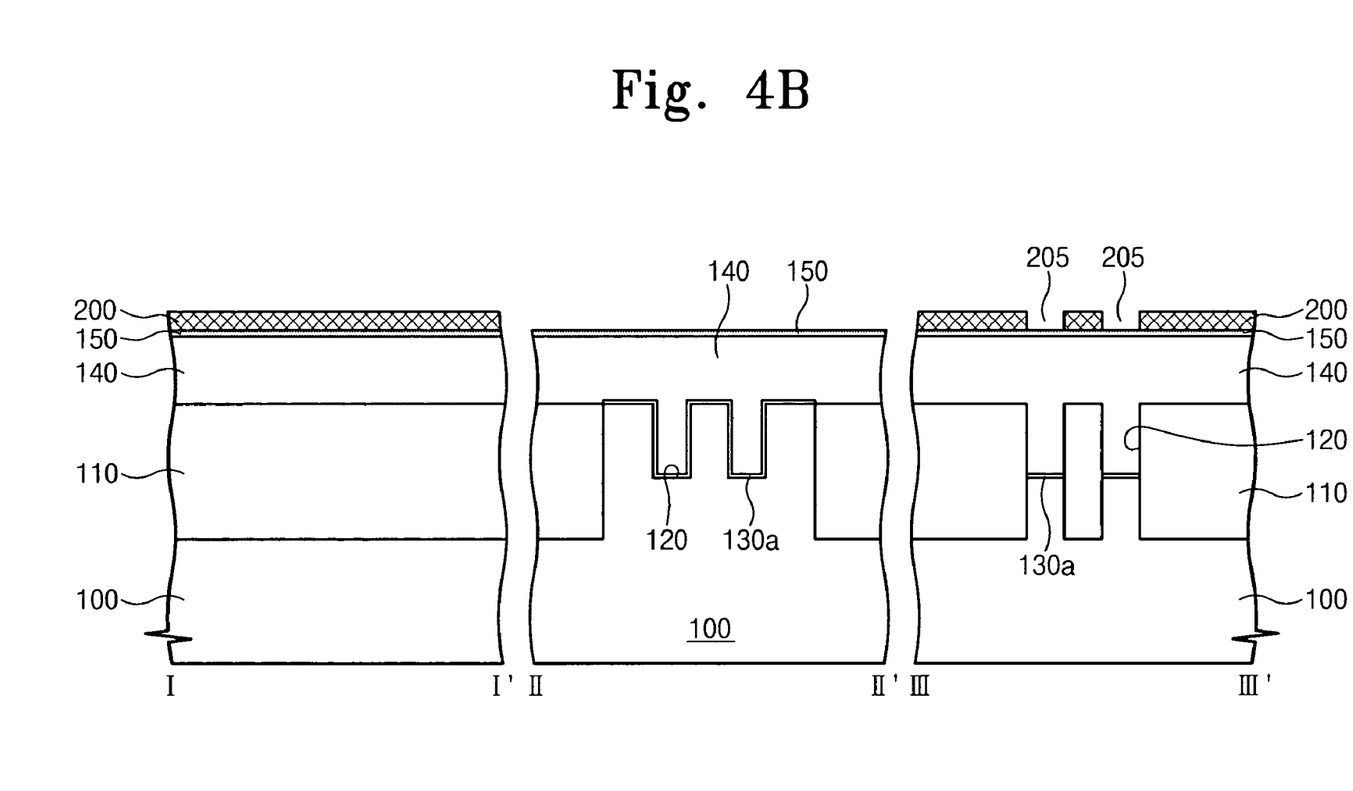

As shown in FIG. 4B, a gate insulating layer 130a is formed on the substrate having the recessed regions 120. A polysilicon layer 140 is formed on the gate insulating layer 130a. The polysilicon layer 140 may be formed, for example, to a thickness of about 500 to 1500 Å. The polysilicon layer 140 is formed to fill the recessed regions 120. A barrier layer 150 is formed on the polysilicon layer 140. The barrier layer 150 may be formed, for example, to a thickness of about 10 to 250 Å.

In some embodiments, the barrier layer 150 may be formed of a silicon nitride layer, a silicon oxynitride layer, a silicon oxide layer or a combination layer thereof. When the barrier layer 150 is formed of a silicon oxide layer, the barrier layer 150 (e.g., the silicon oxide layer) may be formed, for example, to a thickness of about 10 to 250 Å using, for example, a thermal oxidation technique and/or a chemical vapor deposition technique.

A mask pattern 200, for example, a photoresist pattern, is formed on the barrier layer 150. The mask pattern 200 may be formed to have various shapes as illustrated in FIGS. 5 and 6.

Figure 5:
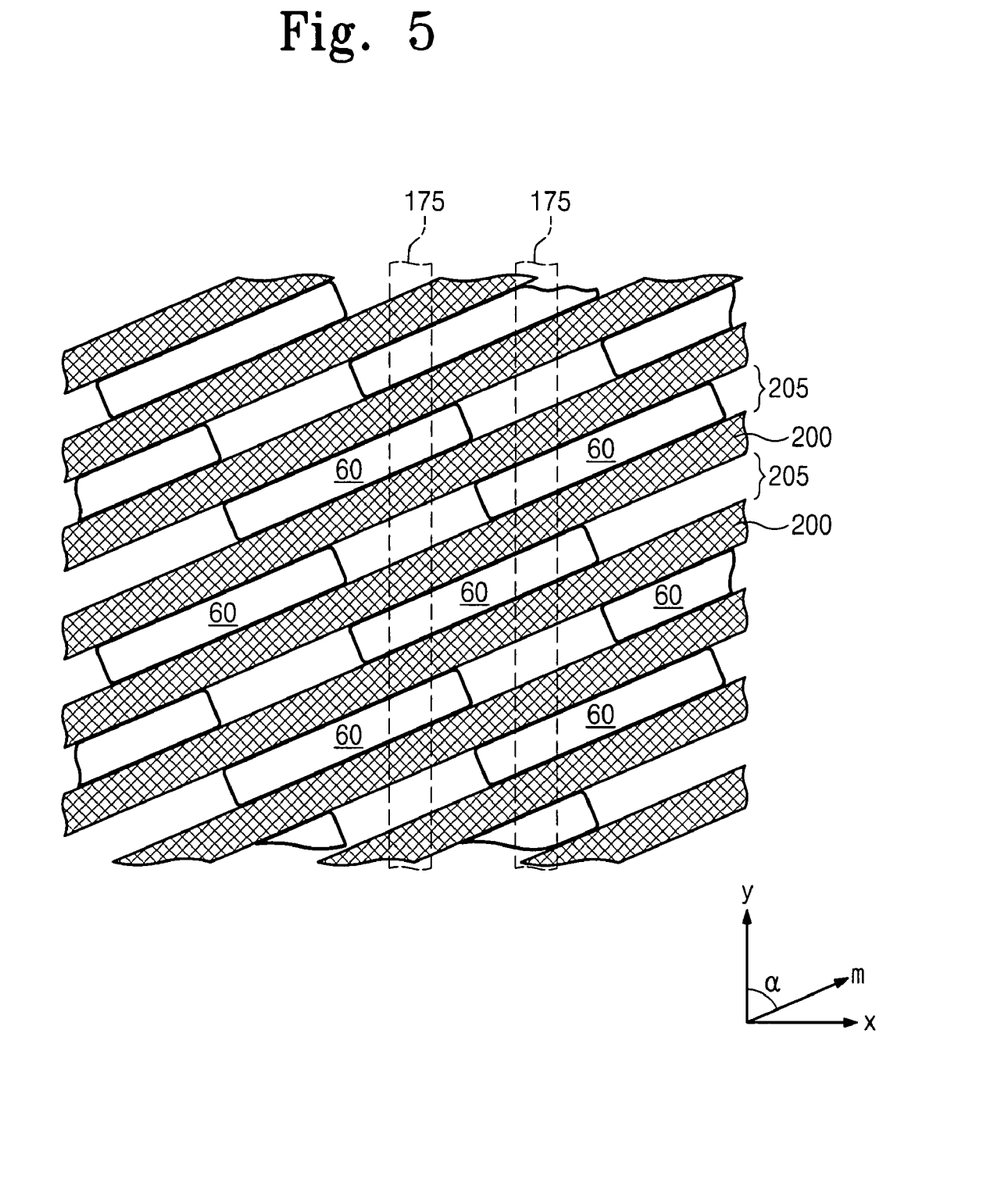
FIGS. 5 to 7 are plan views illustrating photoresist patterns for patterning barrier layers according to some embodiments of the present invention.
Figure 6:
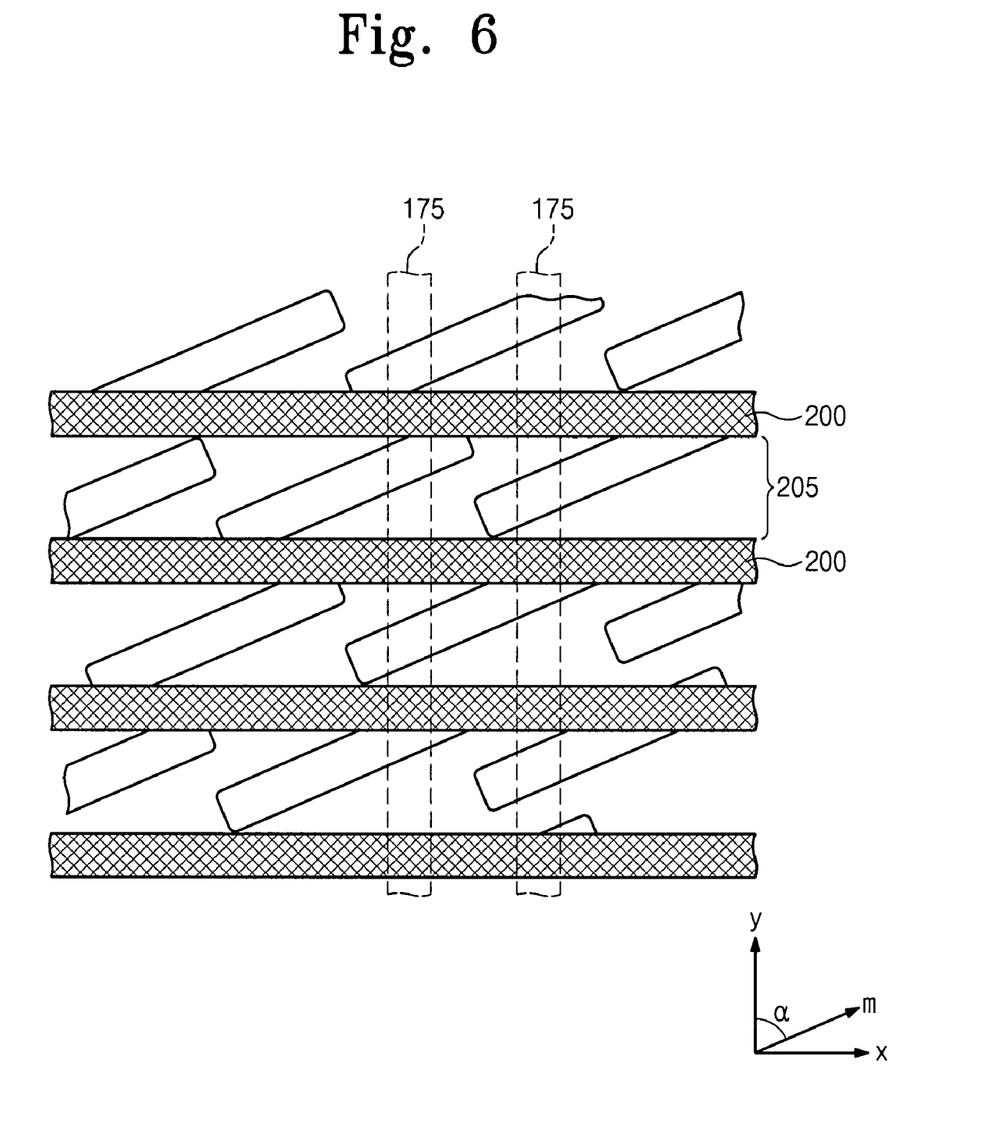
Figure 7:
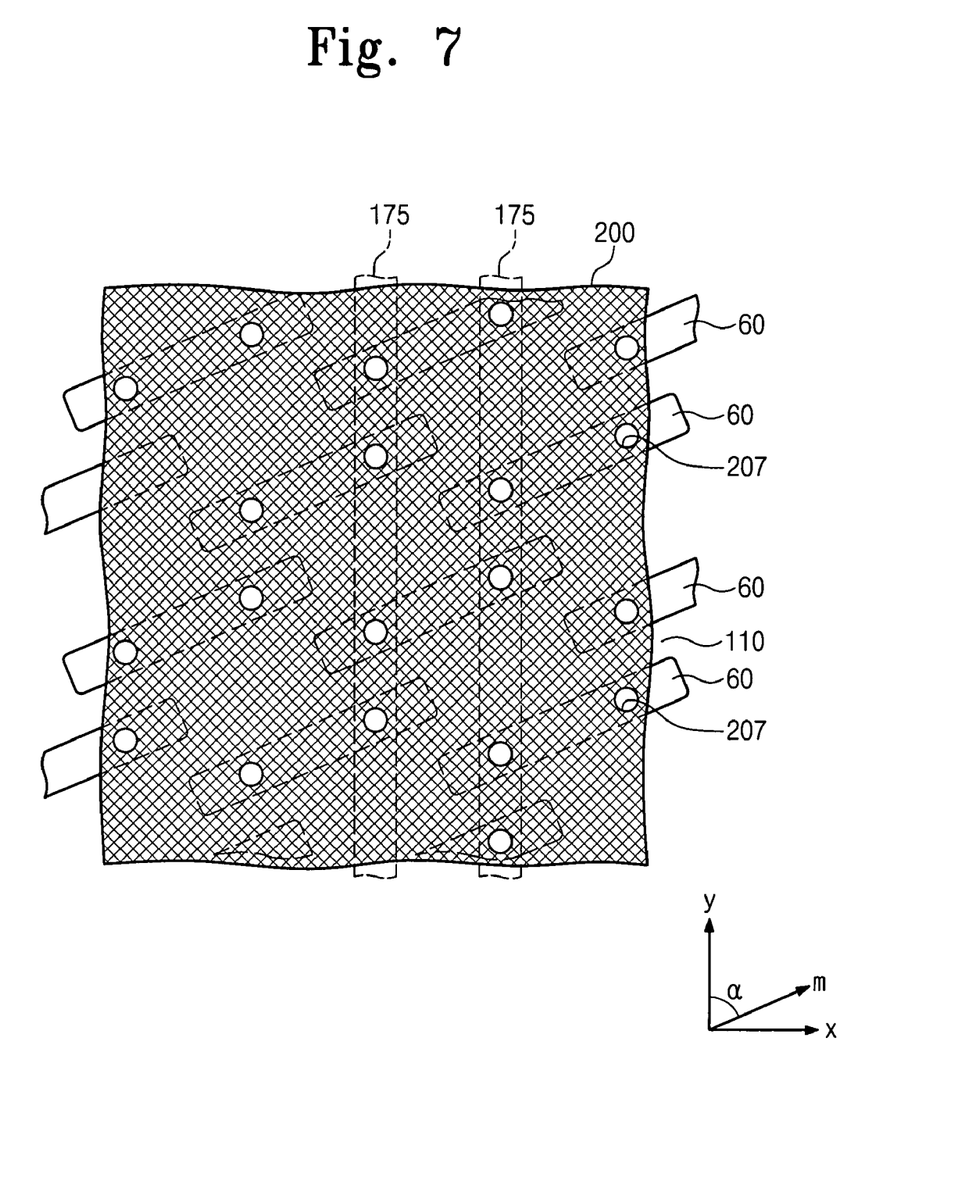

Referring to FIGS. 5 and 6, the mask pattern 200 may be formed to have line-shaped openings 205. Each of the line-shaped openings 205 may overlap with the active regions 60 which are arrayed in a specific inclined row, as shown in FIG. 5. In some embodiments, each of the line-shaped openings 205 may be formed to be parallel to the x-axis and to intersect the active regions 60, as shown in FIG. 6. In other embodiments, the mask pattern 200 may be formed to have hole-shaped openings 207 (FIG. 7), which are located over the recessed regions 120. In FIGS. 5, 6 and 7, reference numerals 175 indicated by dotted lines represent gate patterns to be formed in a subsequent process.

Figure 4C:
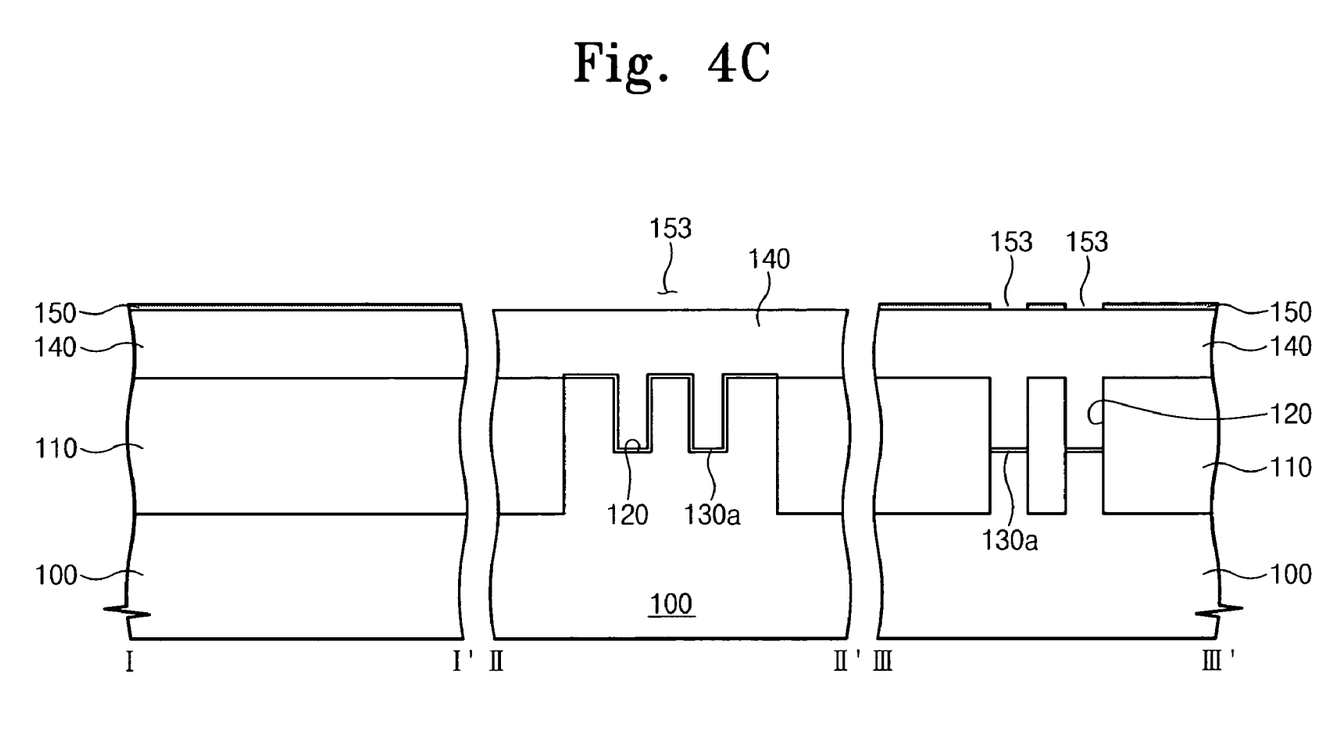

Referring to FIG. 4C, the barrier layer 150 may be etched, using the mask pattern 200 as an etching mask, thereby forming openings 153 that penetrate the barrier layer 150 and expose some portions of the polysilicon layer 140. The mask pattern 150 is then removed.

Figure 4D:
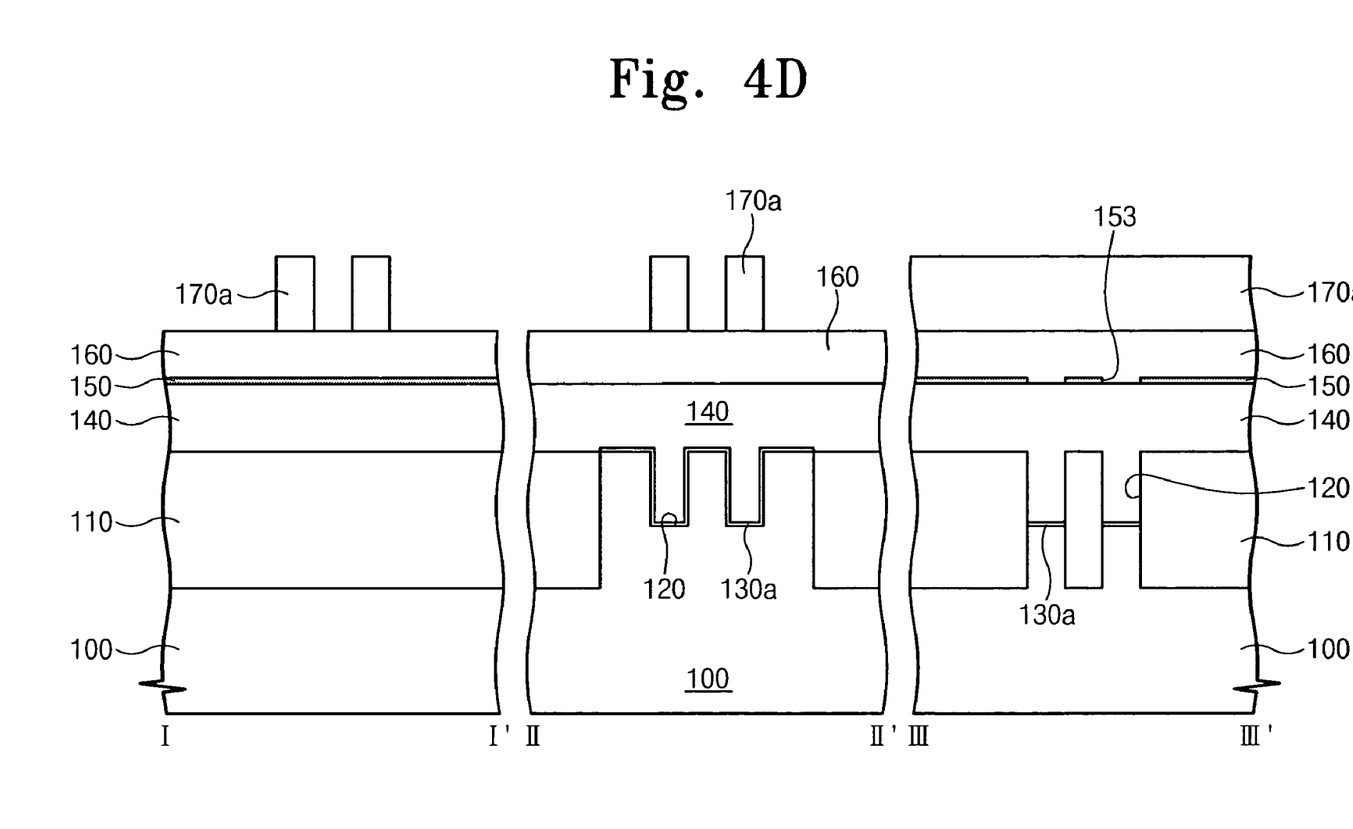

Referring to FIG. 4D, a metal silicide layer 160 is formed on the barrier layer 150 and the polysilicon layer 140 exposed by the openings 153. The metal silicide layer 160 may be formed to a thickness of about 500 to 2000 Å. The metal silicide layer 160 may be formed, for example, of a tungsten silicide layer, a combination layer of tungsten silicide and tungsten nitride, or a combination layer of tungsten, tungsten nitride and tungsten silicide. A plurality of hard mask patterns 170a are shown formed on the metal silicide layer 160. The hard mask patterns 170a may be formed to cross over the active regions 60 and overlap with the recessed regions 120. The hard mask patterns 170a may be formed, for example, of a silicon nitride layer and/or a silicon oxynitride layer.

Figure 4E:
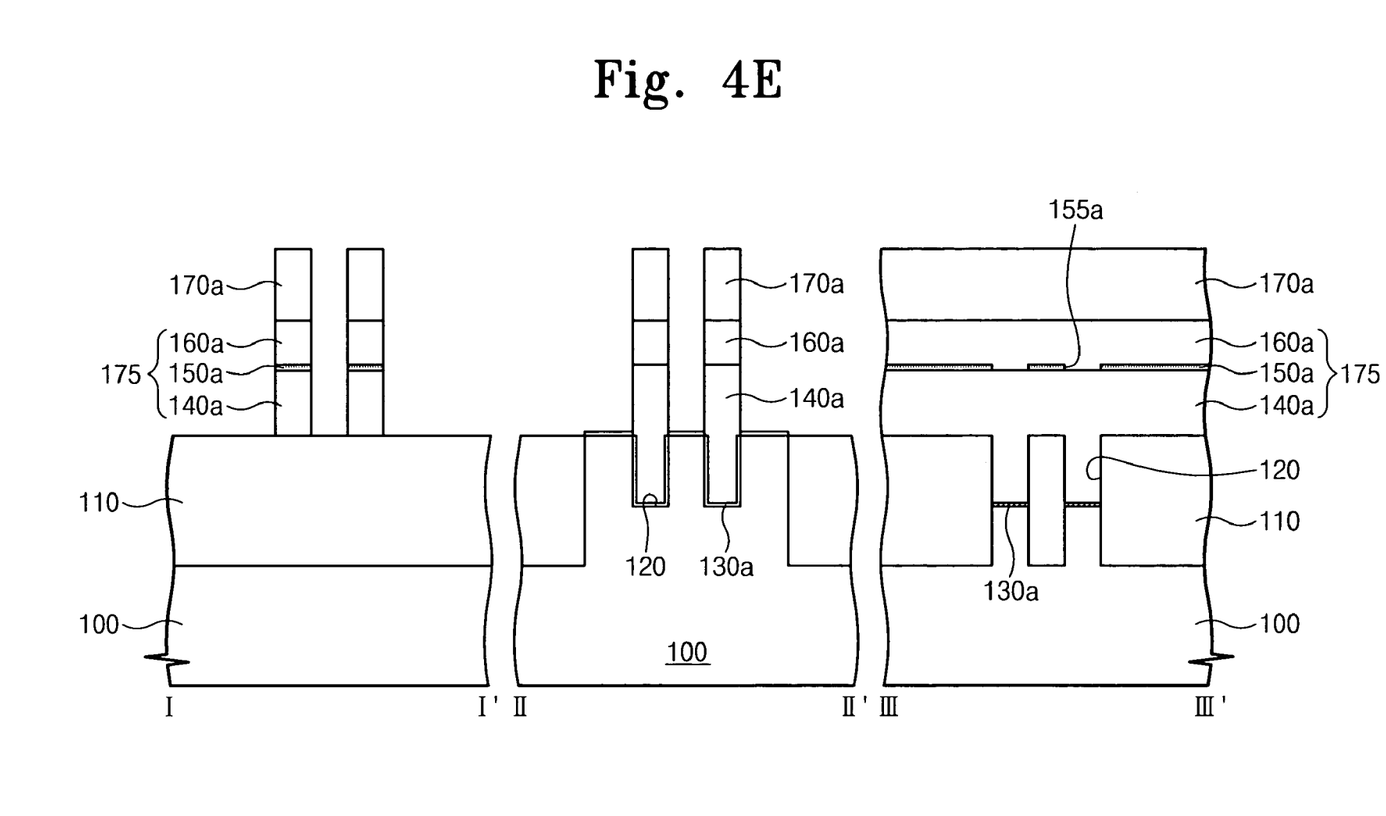

Referring to FIG. 4E, the metal silicide layer 160, the barrier layer 150 and the polysilicon layer 140 are, for example, successively etched using the hard mask patterns 170a as etching masks, thereby forming a plurality of recessed gates 175. A thermal oxidation process may be carried out to cure etch damage caused to the active regions 60 during the etch process for forming the recessed gates 175.

Although not shown in FIG. 4E, impurity ions may be implanted into the active regions 60 using the recessed gates 175 as ion implantation masks, thereby forming lightly doped drain (LDD) regions at both sides of each of the recessed gates 175. Gate spacers may be then formed on sidewalls of the recessed gates 175. Impurity ions may then be implanted into the active regions 60 using the gates 175 and the gate spacers as ion implantation masks, thereby forming high concentration (highly doped) source/drain regions.

An etch stop layer and an interlayer insulating layer may be sequentially formed on the substrate having the high concentration source/drain regions. The etch stop layer may be formed of an insulating layer having an etch selectivity with respect to the interlayer insulating layer. For example, when the interlayer insulating layer is formed of a silicon oxide layer, the etch stop layer may be formed of a silicon nitride layer. The interlayer insulating layer and the etch stop layer may be patterned to form contact holes that expose the high concentration source/drain regions. The contact holes may be formed using the gate spacers as etch top layers. In this case, the contact holes may be self-aligned contact holes.

According to some embodiments as described above, a barrier layer between first and second gate patterns may suppress a silicon consumption phenomenon and a silicon pumping phenomenon where silicon atoms in the first gate pattern are segregated into the second gate pattern during an annealing process. Further, even though the silicon atoms in the first gate pattern are segregated into the second gate pattern through openings in the barrier layer, the barrier layer on both edges of the first gate pattern may act as a support layer to limit or even prevent leaning of the first and second gate patterns.

As described above, in some embodiments, a semiconductor device includes first and second gate patterns sequentially stacked on a semiconductor substrate. A barrier layer pattern is disposed between the first and second gate patterns. The barrier layer pattern is configured to electrically connect the first gate pattern to the second gate pattern.

In some embodiments, the first gate pattern may comprise a polysilicon layer and the second gate pattern may comprise a metal silicide layer. The barrier layer pattern may comprise a material layer that prevents silicon atoms in the first gate pattern from being segregated into the second gate pattern. For example, the barrier layer pattern may comprise a silicon nitride layer, a silicon oxynitride layer, a silicon oxide layer or a combination thereof. The second gate pattern may comprise a tungsten silicide layer, a combination of tungsten silicide and tungsten nitride, or a combination of tungsten, tungsten nitride and tungsten silicide.

In other embodiments, the barrier layer pattern may comprise a plurality of sub-barrier layer patterns that are separated from one another. A portion of the first gate pattern may be exposed by at least one of spaces between the sub-barrier layer patterns.

In still other embodiments, the barrier layer pattern may have an opening that exposes a portion of the first gate pattern.

In other embodiments, the semiconductor device includes an isolation layer formed in a semiconductor substrate to define a plurality of active regions. A first gate pattern is disposed on the active regions and the isolation layer to extend along a first direction. A second gate pattern is stacked on the first gate pattern and a barrier layer pattern is disposed between the first and second gate patterns. The barrier layer pattern is configured to electrically connect the first gate pattern to the second gate pattern.

In some embodiments, at least one recessed region may be additionally provided in each of the active regions. The first gate pattern may fill the recessed region.

In other embodiments, the first gate pattern may comprise a polysilicon layer and the second gate pattern may comprise a metal silicide layer. For example, the second gate pattern may comprise a tungsten silicide layer, a combination of tungsten silicide and tungsten nitride, or a combination of tungsten, tungsten nitride and tungsten silicide. The barrier layer pattern may comprise a silicon nitride layer, a silicon oxynitride layer, a silicon oxide layer or a combination thereof.

In still other embodiments, the barrier layer pattern may comprise a plurality of sub-barrier layer patterns that are separated from one another, and a portion of the first gate pattern may be exposed by at least one of spaces between the sub-barrier layer patterns.

In yet other embodiments, the barrier layer pattern may have an opening that exposes a portion of the first gate pattern.

In still other embodiments, the present invention is directed to a method of fabricating a semiconductor device. The method includes forming a first gate conductive layer on a semiconductor device. A barrier layer is formed on the first gate conductive layer. The barrier layer has an opening that exposes a portion of the first gate conductive layer. A second gate conductive layer is formed on the barrier layer and the exposed portion of the first gate conductive layer. The second gate conductive layer, the barrier layer and the first gate conductive layer are patterned to form a first gate pattern, a barrier layer pattern disposed on the first gate pattern to have the opening, and a second gate pattern disposed on the barrier layer pattern to contact the first gate pattern through the opening.

In some embodiments, an isolation layer may be formed in the semiconductor substrate to define an active region, prior to formation of the first gate conductive layer. A portion of the active region may be then etched to form at least one recess region in the active region. The first gate conductive layer may be formed to fill the recessed region and to cover the active region and the isolation layer. The opening may be formed over at least one of the active region and the isolation layer.

In other embodiments, the first gate conductive layer may comprise a polysilicon layer and the second gate conductive layer comprises a metal silicide layer.

In still other embodiments, the barrier layer may comprise a silicon nitride layer, a silicon oxynitride layer, a silicon oxide layer or a combination thereof.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. An integrated circuit device comprising:
an integrated circuit substrate;
a first gate pattern on the substrate;
a non-conductive barrier layer pattern on the first gate pattern, the barrier layer pattern having openings at selected locations therein extending to the first gate pattern,
wherein the barrier layer pattern comprises a plurality of sub-barrier layer patterns that are separated from one another to define the openings in the barrier layer pattern and wherein a portion of the first gate pattern is exposed by at least one of spaces between the sub-barrier layer patterns; and
a second gate pattern on the barrier layer pattern and extending into the opening in the barrier layer pattern to electrically connect the second gate pattern to the first gate pattern, wherein the second gate pattern comprises a tungsten silicide layer, a combination of tungsten silicide and tungsten nitride, or a combination of tungsten, tungsten nitride and tungsten silicide.

2. The integrated circuit device of claim 1, wherein the first gate pattern comprises a polysilicon layer and the second gate pattern comprises a metal silicide layer.

3. The integrated circuit device of claim 2, wherein the barrier layer pattern comprises a material layer that limits movement of silicon atoms from the first gate pattern into the second gate pattern.

4. The integrated circuit device of claim 3, wherein the barrier layer pattern comprises a silicon nitride layer, a silicon oxynitride layer and/or a silicon oxide layer.

5. The integrated circuit device of claim 2, wherein the barrier layer pattern comprises a silicon nitride layer, a silicon oxynitride layer and/or a silicon oxide layer.

6. An integrated circuit device comprising:
an integrated circuit substrate;
an isolation layer in the substrate that defines a plurality of active regions;
a first gate pattern disposed on the active regions and the isolation layer that extends along a gate pattern direction;
a second gate pattern on the first gate pattern, wherein the second gate pattern comprises a tungsten silicide layer, a combination of tungsten silicide and tungsten nitride, o1" a combination of tungsten, tungsten nitride and tungsten silicide; and
a barrier layer pattern between the first and second gate patterns, wherein the barrier layer pattern is configured to electrically connect the first gate pattern to the second gate pattern,
wherein the barrier layer pattern comprises a plurality of sub-barrier layer patterns that are separated from one another and wherein a portion of the first gate pattern is exposed by at least one of spaces between the sub-barrier layer patterns.

7. The integrated circuit device of claim 6, further comprising at least one recessed region in each of the active regions, wherein the first gate pattern fills the recessed region in each of the active regions.

8. The integrated circuit device of claim 7, wherein the first gate pattern comprises a polysilicon layer and the second gate pattern comprises a metal silicide layer.

9. The integrated circuit device of claim 8, wherein the barrier layer pattern comprises a silicon nitride layer, a silicon oxynitride layer and/or a silicon oxide layer.

10. The integrated circuit device of claim 6, wherein the barrier layer pattern has an opening that exposes a portion of the first gate pattern.

11. A method of fabricating an integrated circuit device, comprising:
forming a first gate conductive layer on an integrated circuit substrate;
forming a non-conductive barrier layer on the first gate conductive layer, the barrier layer having an opening that exposes a portion of the first gate conductive layer;
forming a second gate conductive layer on the barrier layer and extending into the opening to electrically connect the second gate conductive layer to the first gate conductive layer; and
patterning the second gate conductive layer, the barrier layer and the first gate conductive layer to form a first gate pattern, a barrier layer pattern disposed on the first gate pattern, and a second gate pattern disposed on the barrier layer pattern and extending into the opening to contact the first gate pattern,
wherein the second gate pattern comprises a tungsten silicide layer, a combination of tungsten silicide and tungsten nitride, or a combination of tungsten, tungsten nitride and tungsten silicide,
wherein forming the barrier layer comprises forming a plurality of sub-barrier layer patterns that are separated from one another to define the opening in the barrier layer pattern and wherein a portion of the first gate pattern is exposed by at least one of spaces between the sub-barrier layer patterns.

12. The method of claim 11, wherein forming the first gate conductive layer is preceded by:
forming an isolation layer in the integrated circuit to define an active region; and
etching a portion of the active region to form at least one recess region in the active region,
wherein the forming the first gate conductive layer includes forming the first gate conductive layer to fill the recessed region and to cover the active region and the isolation layer.

13. The method of claim 12, wherein forming the barrier layer includes forming the opening over the active region and/or the isolation layer.

14. The method of claim 11, wherein the first gate conductive layer comprises a polysilicon layer and the second gate conductive layer comprises a metal silicide layer.

15. The method of claim 11, wherein the barrier layer comprises a silicon nitride layer, a silicon oxynitride layer and/or a silicon oxide layer.

* * * * *